United States Patent
Narushima et al.

(10) Patent No.: US 7,906,442 B2
(45) Date of Patent: Mar. 15, 2011

(54) GAS TREATMENT METHOD AND COMPUTER READABLE STORAGE MEDIUM

(75) Inventors: Kensaku Narushima, Nirasaki (JP); Satoshi Wakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 543 days.

(21) Appl. No.: 11/993,506

(22) PCT Filed: Jun. 20, 2006

(86) PCT No.: PCT/JP2006/312335
§ 371 (c)(1),
(2), (4) Date: Dec. 21, 2007

(87) PCT Pub. No.: WO2006/137402
PCT Pub. Date: Dec. 28, 2006

(65) Prior Publication Data
US 2010/0081292 A1    Apr. 1, 2010

(30) Foreign Application Priority Data
Jun. 24, 2005    (JP) .................. 2005-184738

(51) Int. Cl.
*H01L 21/31*    (2006.01)
*H01L 21/469*    (2006.01)

(52) U.S. Cl. ................. 438/785; 438/775; 257/E21.006
(58) Field of Classification Search ......................... None
See application file for complete search history.

(56) References Cited

FOREIGN PATENT DOCUMENTS

| JP | 61 229319 | | 10/1986 |
| JP | 2931173 | | 5/1999 |
| JP | 2931173 B | * | 5/1999 |
| JP | 2003 313666 | | 11/2003 |
| JP | 2003313666 A | * | 11/2003 |

* cited by examiner

*Primary Examiner* — David Vu
*Assistant Examiner* — Shantanu C Pathak
(74) *Attorney, Agent, or Firm* — Oblon, Spivak, McClelland, Maier & Neustadt, L.L.P.

(57) ABSTRACT

A gas delivery apparatus comprises: a chamber surrounding a substrate to be processed; a showerhead disposed within the chamber; and gas supply means supplying a gas comprising a mixture of $NH_3$ and $H_2$ to the chamber, in which a coating layer deposited on the interior of the chamber and the showerhead contain nickel (Ni). When the apparatus is utilized to practice a method comprising exposing an object W to a gas comprising a mixture consisting of $NH_3$ and $H_2$, the $H_2/NH_3$ gas flow rate ratio and the temperature are controlled so that the reaction of nickel contained in the coating layer deposited on the interior of the chamber and the showerhead is suppressed.

17 Claims, 6 Drawing Sheets

GAS TREATMENT METHOD AND COMPUTER READABLE STORAGE MEDIUM

TECHNICAL FIELD

The present invention relates to a gas processing method comprising exposing an object to be processed to a gas containing $NH_3$ and $H_2$ at high temperature in the presence of a member at least the surface of which contains nickel (Ni). The present invention further relates to a computer readable storage medium for implementing such a gas processing method.

BACKGROUND ART

In the manufacture of a semiconductor device, semiconductor wafer (hereinafter, referred to simply as a wafer) serving as a substrate to be processed is exposed to a process gas capable of depositing or etching material on the substrate. The gas process is carried out, comprising the steps of: placing a wafer in a chamber; and supplying a reactant gas (corrosive gas), for example, a process gas containing halogen such as Cl, F, etc., to the chamber while decreasing pressure within the chamber. For example, a CVD process using Ti, TiN, W, etc., includes the steps of: heating a wafer, for example, to a temperature of 700 degrees C.; energizing a process gas into a plasma state if desired; and introducing the process gas (deposition gas) comprising a halogen-containing gas and a reducing gas into a chamber while decreasing pressure within the chamber to deposit a film.

However, when the process gas comprising a halogen-containing gas is used, Al, Fe, or Cu, etc., present in an Al alloy (e.g., JIS A 5052) or a stainless steel, of which an inner wall of a chamber or a member such as a showerhead mounted in a chamber is composed, reacts with by-product hydrogen halides such as HCl, HF, or the like, resulting from a gas reaction, thereby forming the corresponding metal halides. The metal halides are readily vaporized because of their increased vapor pressure in a chamber held at a reduced pressure and then diffuse towards the surface of the chamber, resulting in the formation of particles in the chamber or the introduction of particles into films during film deposition and thus the accumulation of metal contaminants on a wafer.

The metal contaminants tend to diffuse into a diffused layer in a silicon substrate through the bottom of a contact hole of a wafer and negatively impact transistor device performance, resulting in reduced breakdown voltage and poor quality ohmic contacts.

Recently, the pattern on a wafer have been further miniaturized, for example, the size of contact holes has been decreased to a level of about 0.13 micrometers in diameter and the depth of a diffused layer in a silicon substrate has been reduced to about 80 nm. Accordingly, as the depth of a diffused layer in a silicon substrate continues to shallow (shallow junction), the above-mentioned metal contaminants have an increasingly negative impact on transistor device performance and thus there is now an increased demand to provide a method for reducing metal contaminants. The reduction of metal contaminants is very important particularly in a metal film formation using a CVD method.

As a solution to the above problems, a method for coating the surface of chamber components, such as chamber wall and showerhead, with Ni, etc., has been disclosed in Patent document 1. When a nickel metal is in contact with halogen-containing gas, nickel halides might be formed. However, in this case, the nickel halides are low in vapor pressure and can hardly be vaporized and thus relatively smaller quantities of nickel halides are present as particles within a chamber, thereby reducing metal contaminants on a wafer.

However, even if the surface of the chamber components are made of nickel, there might be a problem in which nickel compounds nucleate to form particles when a process gas comprising $NH_3$ and $H_2$ is used to nitride a Ti film after deposition of Ti film on a member while the member is heated to a temperature as high as not less than 450° C.

[Patent Document 1] Jpn. Pat. Appln. KOKAI Publication No. 2003-313666

DISCLOSURE OF INVENTION

An object of the present invention is to provide a gas processing method that is hard to generate particles when an object to be processed is processed by gases containing $NH_3$ gas and $H_2$ gas in the presence of a high temperature member at least the surface of which contains nickel (Ni).

Further, another object of the present invention is to provide a computer-readable medium configured to implement the gas processing method.

According to the first aspect of the present invention, there is provided a gas processing method for performing a gas processing to an object to be processed by means of gases containing $NH_3$ gas and $H_2$ gas in the presence of a high temperature member at least the surface of which contains nickel (Ni), the method comprising:

controlling the ratio of flow rate of $H_2$ to $NH_3$ and the temperature of the member, so that the reaction of nickel contained in the member is suppressed.

According to the second aspect of the present invention, there is provided a gas processing method for performing a gas processing to a substrate to be processed by means of gases containing $NH_3$ gas and $H_2$ gas using a gas processing apparatus comprising a chamber accommodating an object to be processed; an in-chamber member disposed within the chamber; gas supply means for supplying a gas mixture containing at least $NH_3$ gas and $H_2$ gas to the chamber, wherein a portion of the chamber and/or the in-chamber member that is exposed to the gas a mixture containing $NH_3$ gas and $H_2$ gas contains nickel (Ni), the method comprising:

controlling the ratio of flow rate of $H_2$ to $NH_3$ and the temperature of the chamber and/or the in-chamber member, so that the reaction of nickel contained in the member is suppressed.

According to the first or second aspect of the invention, a following expression (a) is satisfied, in a temperature range of not higher than 550° C. where x is the temperature and y is the ratio of flow rate of $H_2$ to $NH_3$.

$$y > -1.80 \times 10^{-4} x^2 + 2.19 \times 10^{-1} x - 6.20 \times 10^1 \quad (a)$$

According to the first or second aspect of the invention, a following expression (b) is satisfied, in a temperature range of not higher than 550° C. where x is the temperature and y is the ratio of flow rate of $H_2$ to $NH_3$.

$$y > -3.80 \times 10^{-4} x^2 + 4.19 \times 10^{-1} x - 1.12 \times 10^2 \quad (b)$$

According to the first or second aspect of the invention, a following expression (c) is satisfied, in a temperature range of not higher than 550° C., where x is the temperature and y is the ratio of flow rate of $H_2$ to $NH_3$.

$$y > 8.1 \times 10^{-4} x^2 - 7.11 \times 10^{-1} x + 1.56 \times 10^2 \quad (c)$$

According to the first or second aspect of the invention, a following expression (d) is satisfied, in a temperature range of not higher than 550° C. where x is the temperature and y is the ratio of flow rate of $H_2$ to $NH_3$.

$$y > 1.42 \times 10^{-3} x^2 - 1.27 \times 10^0 x + 2.85 \times 10^2 \quad \text{(d)}$$

It is preferred that the $H_2$ gas flow rate used to derive the above expressions (a) to (d) is not greater than 2000 mL/min.

In the second aspect of the invention, the gas processing apparatus is adapted to introduce gases containing $TiCl_4$ gas and $H_2$ gas from the gas supply means into the chamber to deposit a Ti film and wherein the gas mixture containing $NH_3$ gas and $H_2$ gas is used to nitride the Ti film. Further, the in-chamber member includes a showerhead for injecting the gas to the object to be processed within the chamber.

According to the third aspect of the invention, there is provided a gas processing method for performing a gas processing to a substrate to be processed using a gas processing apparatus comprising a chamber accommodating a substrate to be processed, gas supply means supplying the gas to the chamber, and a showerhead, disposed within the chamber, for injecting the gas from the gas supply means to the substrate to be processed within the chamber, wherein the inner surface of the chamber and the inner and outer surfaces of the showerhead contain nickel (Ni), the method comprising: precoating the inner surface of the chamber and the inner and outer surface of the showerhead with a TiN film by introducing the gases containing $TiCl_4$ gas and $H_2$ gas from the gas supply means into the chamber through the showerhead, in the absence of the substrate to be processed within the chamber, to deposit a Ti film on the inner surface of the chamber and the inner and outer surfaces of the showerhead and nitriding the Ti film to form a TiN film, depositing a Ti film on the surface of the substrate to be processed, in the presence of the substrate to be processed within the chamber, by introducing the gases containing $TiCl_4$ gas and $H_2$ gas from the gas supply means in to the chamber through the showerhead; and nitriding the Ti film by introducing gases containing $NH_3$ gas and $H_2$ gas from the gas supply means through the showerhead and into the chamber, the nitriding being carried out by controlling the ratio of flow rate of $H_2$ to $NH_3$ and the temperature of the chamber and the showerhead so that the reaction of nickel contained in the showerhead is suppressed.

In the third aspect of the invention, the showerhead may be of the pre-mix type in which a number of gases are mixed interior thereof the showerhead and the mixed gas is discharged thereof.

In the third aspect of the invention, the nitriding the Ti film is carried out so that the following expression (e) in the temperature range of not higher than 550° C. is satisfied, where x is the temperature and y is the ratio of flow rate of $H_2$ to $NH_3$.

$$y > 0 \quad \text{(e)}$$

In the third aspect of the invention, the nitriding the Ti film is carried out so that a following expression (f) is satisfied in the temperature range of not higher than 550° C., where x is the temperature and y is the ratio of flow rate of $H_2$ to $NH_3$.

$$y > 1.00 \times 10^{-4} x^2 - 9.50 \times 10^{-2} x + 2.25 \times 10^1 \quad \text{(f)}$$

In the third aspect of the invention, the nitriding the Ti film is carried out so that a following expression is satisfied in a temperature range of not higher than 550° C., where x is the temperature and y is the ratio of flow rate of $H_2$ to $NH_3$.

$$y > 6.00 \times 10^{-4} x^2 - 5.60 \times 10^{-1} x + 1.31 \times 10^2 \quad \text{(g)}$$

In the third aspect of the invention, the nitriding the Ti film is carried out so that a following expression (h) is satisfied in a temperature range of not higher than 550° C., where x is the temperature and y is the ratio of flow rate of $H_2$ to $NH_3$.

$$y > 2.80 \times 10^{-4} x^2 - 2.60 \times 10^{-1} x + 6.03 \times 10^1 \quad \text{(h)}$$

In the third aspect of the invention, the nitriding the Ti film is carried out so that a following expression (i) is satisfied in a temperature range of not higher than 550° C., where x is the temperature and y is the ratio of flow rate of $H_2$ to $NH_3$.

$$y > 6.68 \times 10^{-4} x^2 - 6.08 \times 10^{-1} x + 1.38 \times 10^2 \quad \text{(i)}$$

It is preferred that the $H_2$ gas flow rate used to derive the above expressions (e) to (i) is not greater than 5000 mL/min.

According to the fourth aspect of the invention, there is provided a computer readable storage medium that stores a control program for execution on a computer causing the computer to control a gas processing apparatus, wherein the control program, when executed, causes the computer to control the gas processing apparatus to perform a gas processing method for performing a gas processing to an object to be processed by means of gases containing $NH_3$ gas and $H_2$ gas in the presence of a high temperature member at least the surface of which contains nickel (Ni), the method comprising controlling the ratio of flow rate of $H_2$ to $NH_3$ and the temperature of the member, so that the reaction of nickel contained in the member is suppressed.

According to the fifth aspect of the invention, there is provided a computer readable storage medium that stores a control program for execution on a computer causing the computer to control a gas processing apparatus to perform a gas processing method, wherein the control program, when executed, causes the computer to control the gas processing apparatus to perform a gas processing method for performing a gas processing to a substrate to be processed by means of gases containing $NH_3$ gas and $H_2$ gas using the gas processing apparatus comprising a chamber accommodating an object to be processed; an in-chamber member disposed within the chamber; gas supply means for supplying a gas mixture containing at least $NH_3$ gas and $H_2$ gas to the chamber, wherein a portion of the chamber and/or the in-chamber member that is exposed to the gas a mixture containing $NH_3$ gas and $H_2$ gas contains nickel (Ni), the method comprising: controlling the ratio of flow rate of $H_2$ to $NH_3$ and the temperature of the chamber and/or the in-chamber member, so that the reaction of nickel contained in the member is suppressed.

According to the sixth aspect of the invention, there is provided a computer readable storage medium that stores a control program for execution on a computer causing the computer to control a gas processing apparatus to perform a gas processing method, wherein the control program, when executed, directing the computer to instruct the gas processing apparatus to perform a gas processing method for performing a gas processing to a substrate to be processed using a gas processing apparatus comprising a chamber accommodating a substrate to be processed, gas supply means supplying the gas to the chamber, and a showerhead, disposed within the chamber, for injecting the gas from the gas supply means to the substrate to be processed within the chamber, wherein the inner surface of the chamber and the inner and outer surfaces of the showerhead contain nickel (Ni), the method comprising: precoating the inner surface of the chamber and the inner and outer surface of the showerhead with a TiN film by introducing the gases containing $TiCl_4$ gas and $H_2$ gas from the gas supply means into the chamber through the showerhead, in the absence of the substrate to be processed within the chamber, to deposit a Ti film on the inner surface of the chamber and the inner and outer surfaces of the showerhead and nitriding the Ti film to form a TiN film, depositing a Ti film on the surface of the substrate to be processed, in the presence of the substrate to be processed within the chamber, by introducing the gases containing $TiCl_4$ gas and $H_2$ gas from the gas supply means in to the chamber through the showerhead; and nitriding the Ti film by introducing gases containing $NH_3$ gas and $H_2$ gas from the gas supply means through the showerhead and into the chamber, the nitriding being carried out by controlling the ratio of flow rate of $H_2$ to $NH_3$ and the temperature of the chamber and the showerhead so that the reaction of nickel contained in the showerhead is suppressed.

According to the present invention, the $H_2/NH_3$ gas flow rate ratio and the temperature of the member at least the surface of which contains nickel (Ni) are controlled to suppress a reaction of nickel contained in the coating layers, thereby suppressing particles of nickel-compounds in a desirable range.

BEST MODE FOR CARRYING OUT THE INVENTION

Embodiments of the present invention will now be described with reference to the accompanying drawings.

Figure 1:
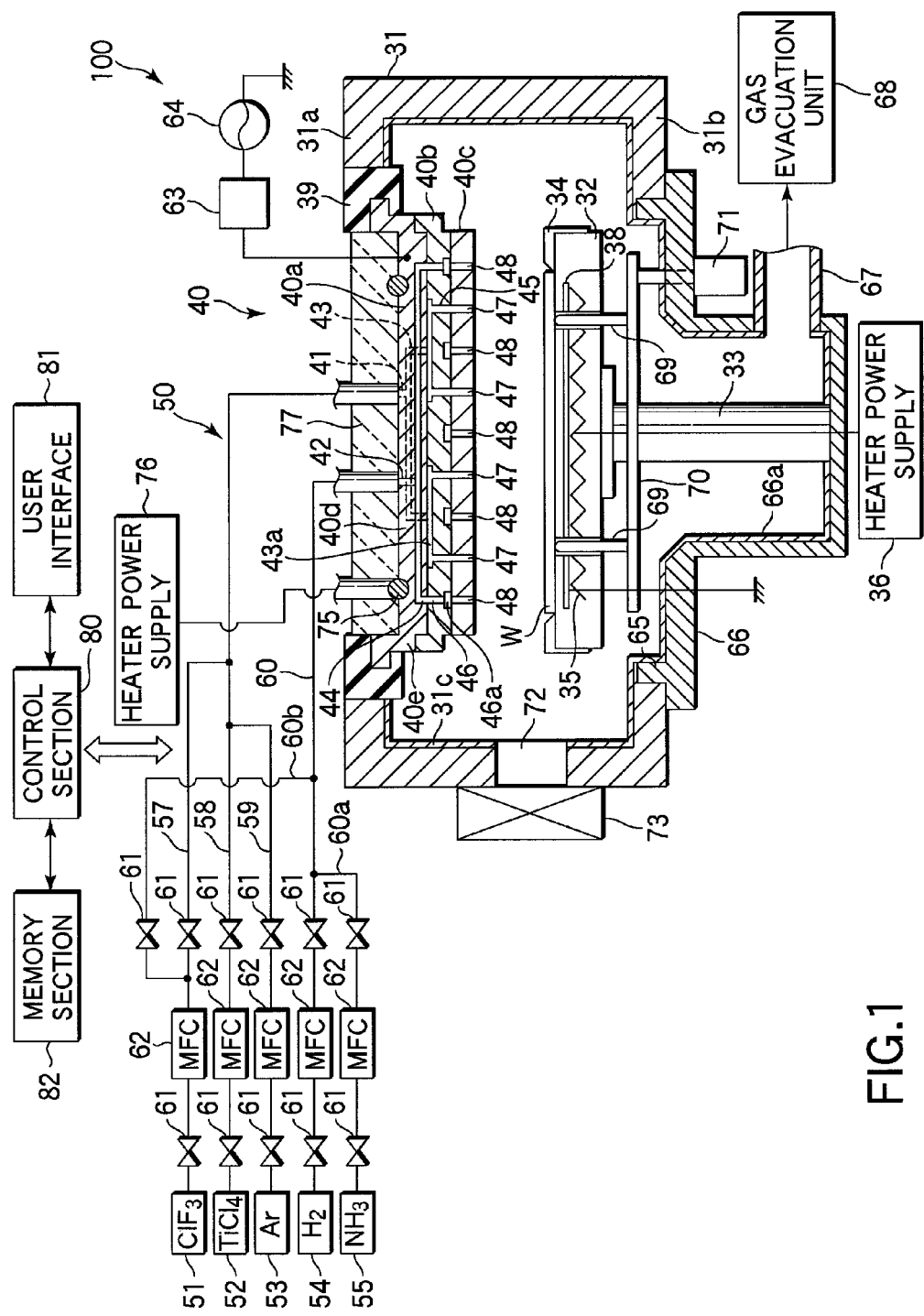
FIG. 1 is a schematic cross sectional view showing a Ti film deposition apparatus for performing a gas processing method according to the present invention.

First, a Ti film deposition apparatus implementing a gas processing method will be explained. FIG. 1 is a schematic cross sectional view showing a Ti film deposition apparatus implementing a gas processing method according to the present invention. The Ti film deposition apparatus 100 comprises a cylinder-shaped chamber 31. The chamber 31 comprises a base member made of aluminum or aluminum alloy (e.g., JIS A5052) and having an inner wall surface covered with a coating layer 31c containing nickel. The coating layer 31c containing nickel is typically made of pure nickel or nickel-base alloy. Nickel in the coating layer 31c reacts with a halogen-containing gas to form metal compounds having a low vapor pressure. The coating layer 31c is formed, for example, by ion plating, electroplating, spraying, etc.

Contained in the chamber 31 is a susceptor 32 which is horizontally positioned to support wafer W as an object to be processed and supported by a cylindrical support member 33 disposed below the center of the susceptor. The susceptor 32 has a guide ring 34 provided at the outer periphery thereof to guide the wafer W. Further, the susceptor 32 has a heater 35 embedded therein to heat the object wafer W to an intended temperature by a power drawn from a heater power supply 36. The susceptor 32 has a buried electrode 38 disposed just below the top surface thereof and connected to the ground. Incidentally, the susceptor 32 may be made of ceramics such as AlN and in this case, form a ceramics heater.

The chamber 31 has a showerhead 40 mounted to the ceiling wall 31a thereof through an insulating member 39 and serving as a gas discharging member. The showerhead 40 is comprised of upper block 40a, middle block 40b, lower block 40c and is generally shaped in the form of a disk. The upper block 40a has a horizontal section 40d forming a showerhead body together with the middle block 40b and lower block 40c, and an annular support 40e continually extending along the outer periphery of the horizontal section 40d, thereby forming a recess structure. Accordingly, the entire showerhead 40 is supported by the annular support 40e. The showerhead 40 is made of a material containing Ni, typically made of pure Ni or Ni-base alloy. Further, the lower block 40c is provided with discharge holes 47 and 48 alternately arranged. The upper block 40a has first gas inlet 41 and second gas inlet 42 provided at the upper surface thereof. A number of gas passages 43 extend from the first gas inlet 41 into the upper block 40a. The middle block 40b has gas passages 45 provided therein and the above-mentioned gas passages 43 are in fluid communication with these gas passages 45 via horizontal communication passages 43a. Further, the gas passages 45 are in fluid communication with the discharge holes 47 in the lower block 40c. Further, a number of gas passages 44 extend from the second gas inlet 42 into the upper block 40a. The middle block 40b has gas passages 46 provided therein and the above-mentioned gas passages 44 are in fluid communication with these gas passages 46. Further, the gas passages 46 are connected to horizontal communication passages 46a extending horizontally in the middle block 40b, which are in fluid communication with a number of discharge holes 48 in the lower block 40c. The above mentioned first and second gas inlets 41, 42 are connected to gas supply lines of a gas supply mechanism 50.

The gas supply mechanism 50 comprises $ClF_3$ gas supply source 51 for supplying $ClF_3$ gas using as cleaning gas, $TiCl_4$ gas supply source 52 for supplying $TiCl_4$ gas used as Ti compound gas, Ar gas supply source 53 for supplying Ar gas, $H_2$ gas supply source 54 for supplying $H_2$ gas used as reducing gas, and $NH_3$ gas supply source 55 for supplying $NH_3$ gas used as nitriding gas. Further, $ClF_3$ gas supply lines 57 and 60b are connected to the $ClF_3$ gas supply source 51, a $TiCl_4$ gas supply line 58 is connected to the $TiCl_4$ gas supply source 52, an Ar gas supply line 59 is connected to the Ar gas supply source 53, a $H_2$ gas supply line 60 is connected to the $H_2$ gas supply source 54, and a $NH_3$ gas supply line 60a is connected to the $NH_3$ gas supply source 55. Further, though not shown, the mechanism 50 also comprises a $N_2$ gas supply source. Additionally, a mass flow controller 62 and two valves 61 between which there is present the mass flow controller 62 are connected to each of the gas lines.

The $TiCl_4$ gas supply line 58 extending from the $TiCl_4$ gas supply source 52 is connected to said first gas inlet 41. Further, the $ClF_3$ gas supply line 57 extending from the $ClF_3$ gas supply source 51 and the Ar gas supply line 59 extending from the Ar gas supply source 53 are connected to the $TiCl_4$ gas supply line 58. Further, the $H_2$ gas supply line 60 extending from the $H_2$ gas supply source 54 is connected to said second gas inlet 42. Additionally, the $NH_3$ gas supply line 60a extending from the $NH_3$ gas supply source 55 and the $ClF_3$ gas supply line 60b extending from the $ClF_3$ gas supply source 51 are connected to the $H_2$ gas supply line 60. Accordingly, during process operation, $TiCl_4$ gas from the $TiCl_4$ gas supply source 52, together with Ar gas from the Ar gas supply source 53, flows through the $TiCl_4$ gas supply line 58 and the first gas inlet 41 of the showerhead 40 into the showerhead 40, and then flows through the gas passages 43, 45 and is discharged from the discharge hole 47 into the chamber 31. Further, $H_2$ gas from the $H_2$ gas supply source 54 flows through the $H_2$ gas supply line 60 and the second gas inlet 42 of the showerhead 40 into the showerhead 40, and then flows through the gas passages 44, 46 and is discharged from the discharge hole 48 into the chamber 31. In this case, the showerhead 40 is of the post-mix type where $TiCl_4$ and $H_2$ gases are independently supplied to the chamber 31 and are mixed after being discharged.

A high frequency power supply 64 is connected to the showerhead 40 through a matching box 63 and high frequency power is supplied from the high frequency power supply 64 to the showerhead 40 if needed. The supply of high frequency power from the high frequency power supply 64 causes a gas mixture discharged from the showerhead 40 into the chamber 31 to be excited to a plasma state to cause deposition.

Further, the horizontal section 40d of an upper plate 40a of the showerhead 40 is provided with a heater 75 for heating the showerhead 40. A heater power supply 76 is connected to the heater 75 and a power is supplied from the heater power supply 76 to the heater 75 to heat the showerhead 40 to an intended temperature. A depression in the upper plate 40a is filled with a heat insulation material 77 to increase thermal efficiency of the heater 75.

A circular hole 65 is formed in the center of a bottom wall 31b of the chamber 31 and an exhaust chamber 66 projecting downward is mounted on the bottom wall 31b so as to cover the hole 65. The inner periphery of the exhaust chamber 66 is covered with a coating layer 66a of the same material as that of the above-mentioned coating layer 31c. Connected to the side surface of the exhaust chamber 66 is an exhaust piping 67 to which an evacuation unit 68 is connected. The evacuation unit 68 is activated to reduce the pressure in the chamber 31 to a desired vacuum level.

The susceptor 32 has three (only two of them are shown) wafer support pins 69 mounted retractably in relation to the surface thereof and the wafer support pins 69 may move up and down so that the wafer W resting on the support pins is lifted and lowered. The wafer support pins 69 are fixed to a support plate 70 and moved up and down by a driving mechanism 71 such as an air cylinder via the support plate 70.

The chamber 31 has a transfer port 72, provided in the sidewall thereof, for transferring the wafer W to and from a wafer transfer chamber (not shown), and a gate valve 73 formed on the sidewall for opening/closing the transfer port 72.

The components of the Ti film deposition apparatus 100 are connected to and controlled by a control section 80 consisting of a computer. A user interface 81 consisting of a keyboard, display, etc., is connected to the control section 80. In this case, the keyboard is used for a process operator to input commands for operating the Ti-film deposition apparatus 100 and the display is used for showing visualized images of the operational status of the Ti-film deposition apparatus 100. Further, a memory section 82 is connected to the control section 80 and stores control programs for the control section 80 to control the Ti-film deposition apparatus 100 so as to perform various processes, and programs, i.e., recipes for respective components of the Ti-film deposition apparatus 100 to perform processes in accordance with process conditions. Recipes may be stored in a hard disk or semiconductor memory, or stored in a portable storage medium, such as a CDROM or DVD, to be attached to a predetermined position in the memory section 82. Alternatively, recipes may be transmitted from another apparatus through, e.g., a dedicated line, as needed. A required recipe is retrieved from the storage section 82 and executed by the control section 80 in accordance with an instruction or the like through the user interface 81. Consequently, the Ti-film deposition apparatus 100 can perform a predetermined process under the control of the control section 80. The respective components may be directly controlled by the control section 80, or they may be provided with individual controllers and controlled by the corresponding controllers.

How the above-configured Ti film deposition apparatus 100 functions during deposition process will be explained. In the apparatus, a Ti film deposition process is carried out and then a nitriding process according to the embodiment is conducted in an ambient of $NH_3$ and $H_2$.

It should be noted that in the following, a gas flow rate is given in units of mL/min, however, the volume of a gas largely depends on its temperature and pressure, and thus, in the following, the gas flow rate is expressed when standard conditions of temperature and pressure are applied. Incidentally, the gas flow rate expressed in the standard conditions is typically given in units of sccm (Standard Cubic Centimeter per Minutes) and thus the gas flow rate in units of mL/min is also given in units of sccm. The standard conditions (STP) refer to the normal conditions of a temperature of 0° C. (273.15K) and a pressure of 1 atm (101325 Pa).

First, a Ti-film deposition process will be described.

The deposition process is carried out including the steps of: allowing the evacuation unit 68 to draw exhaust gases out from the chamber 31 in the absence of a wafer W in the chamber 31; allowing the heater 35 to preheat the chamber 31 while introducing Ar gas or $N_2$ gas into the chamber 31; and precoating with a thin film of TiN when the temperature becomes stable. The step of precoating with a thin film of TiN comprises the steps of: allowing the high-frequency power supply 64 to apply a high-frequency power to the showerhead 40 while introducing Ar gas, $H_2$ gas, and $TiCl_4$ gas into the chamber 31 via the showerhead 40 at a predetermined flow rate, so that the gas mixture is excited to a plasma state to cause deposition of a Ti film on the inner wall of the chamber 31, the inner wall of the exhaust chamber 66, and the surface of chamber components such as the showerhead 40; and nitriding the Ti film while supplying Ar gas, $H_2$ gas, and $NH_3$ gas and applying the high-frequency power to excite the gas mixture to a plasma state. The Ti-film deposition step and nitriding step are repeated, preferably 18 to 72 times, and the surface is precoated with a TiN film having a predetermined thickness.

The process further includes the steps of: after precoating, adjusting the pressure in the chamber 31 so that there is no pressure differential between the pressure in the chamber 31 and the external ambient atmosphere with which an interior of the chamber are connected through the gate valve 73; opening the gate valve 73; allowing the wafer transfer device (not shown) to transfer the wafer W from the wafer transfer chamber (not shown) in a vacuum state through the transfer port 72 to the chamber 31; introducing Ar gas into the chamber 31 and preheating the wafer W; when the temperature of the wafer becomes substantially stable, causing the Ar gas, $H_2$ gas, and $TiCl_4$ gas to enter through a pre-flow line (not shown) at a predetermined flow rate; switching the flow from the pre-flow line to a film deposition line while keeping the gas flow rate and pressure unchanged; and introducing the gas mixture through the showerhead 40 into the chamber 31. In the step of introducing the gases, a high-frequency power of 200 to 1000 W, preferably 400 to 800 W, at a frequency of 450 kHz to 60 MHz, preferably 450 kHz to 13.56 MHz is applied by the high-frequency power supply 64 while heating the wafer W to a temperature of about 300 to 700° C., preferably about 450 to 600° C. by the heater 35, thereby exciting Ar gas, $H_2$ gas, and $TiCl_4$ gas gases introduced into the chamber 31 to a plasma state to form a Ti film having a predetermined thickness on the wafer W.

As described above, when $TiCl_4$ and $H_2$ gases are introduced to react with each other to form the Ti film on the wafer W, a halogen-containing material, i.e., HCl is produced as a by-product upon reaction of the $TiCl_4$ and $H_2$ gases. Consequently, if the inner wall of the chamber and the outer portion of the showerhead are made of Al or stainless steel, HCl reacts with metals such as Al, Cu, Fe, etc., contained in the inner wall and outer portion to form metal chlorides such as $AlCl_3$, $CuCl_2$, $FeCl_2$, $FeCl_3$ which are high vapor pressure metal compounds. In this case, residual materials such as those metal chlorides are vaporized during deposition on the wafer W and diffused within the chamber, whereby the materials can migrate into the film, thereby adversely affecting the properties of the film and increasing the amount of metal contamination. In contrast, according to the embodiment, coating layers 31c, 66a composed of a nickel-containing material, typically composed of pure Ni or Ni-based alloy are formed in portions with which halogen-containing gas, i.e., HCl comes in contact and thus react with HCl to form $NiCl_2$. $NiCl_2$ is low in vapor pressure and less likely to evaporate, thereby suppressing to diffuse throughout the chamber and to generate metal contaminants, and reducing the likelihood of metal contamination.

Next, a nitriding process as a process in the atmosphere containing $NH_3$ and $H_2$ according to the embodiment will be described.

The nitriding process includes the steps of: upon completion of a Ti-film deposition process, stopping supply of $TiCl_4$ gas while keeping supply of $H_2$ and Ar gases; supplying $NH_3$ gas as nitriding gas while heating the interior of the chamber 31 (e.g., chamber wall, showerhead surface, etc.); simultaneously, allowing the high-frequency power supply 64 to apply a high-frequency power to the showerhead 40 to excite the process gas to a plasma state; and carrying out nitriding of the surface of the Ti thin film deposited on the wafer W in the presence of the process gas in a plasma state.

The nitriding is carried out typically at high temperature (the temperature of the coating layer) not lower than 450° C. and during nitriding, nickel-containing particles generate. It could be assumed that generation of the particles is due to the fact that the $NH_3$ gas introduced as a nitriding gas and nickel contained in the coating layers 31c, 66a, and showerhead 40 react through the water to form a complex.

Based on the above-assumption, the inventors consider process conditions which affect the reaction of nickel, and found that the temperature and the ratio of flow rate of $H_2$ to $NH_3$ largely affect the reaction and the reaction of nickel can be suppressed and reduce the amount of particles by controlling these condition to fall within a specified range.

In the following, details will be given.

As the allowable range of the number of particles depending on what type of device, it is required that the increase in the number of particles having a size of not less than 0.2 micrometers is less than 100 when one lot (25 pieces) of wafers are processed in the chamber. Preferably, the increase in the number of particles having a size of not less than 0.13 micrometers is less than 100. In order to determine the acceptable range for the above-mentioned requirements, the experiment was carried out such that a Ti film deposited on a 200 mm diameter wafer was nitrided while the flow rate of $H_2$ and $NH_3$ gases and the interior temperature of the chamber were changed. Afterwards, the state of adherence of particles to the wafer was obtained. Incidentally, pure nickel (NC nickel) was used as a material for the nickel-containing coating layer and the showerhead.

Figure 2:
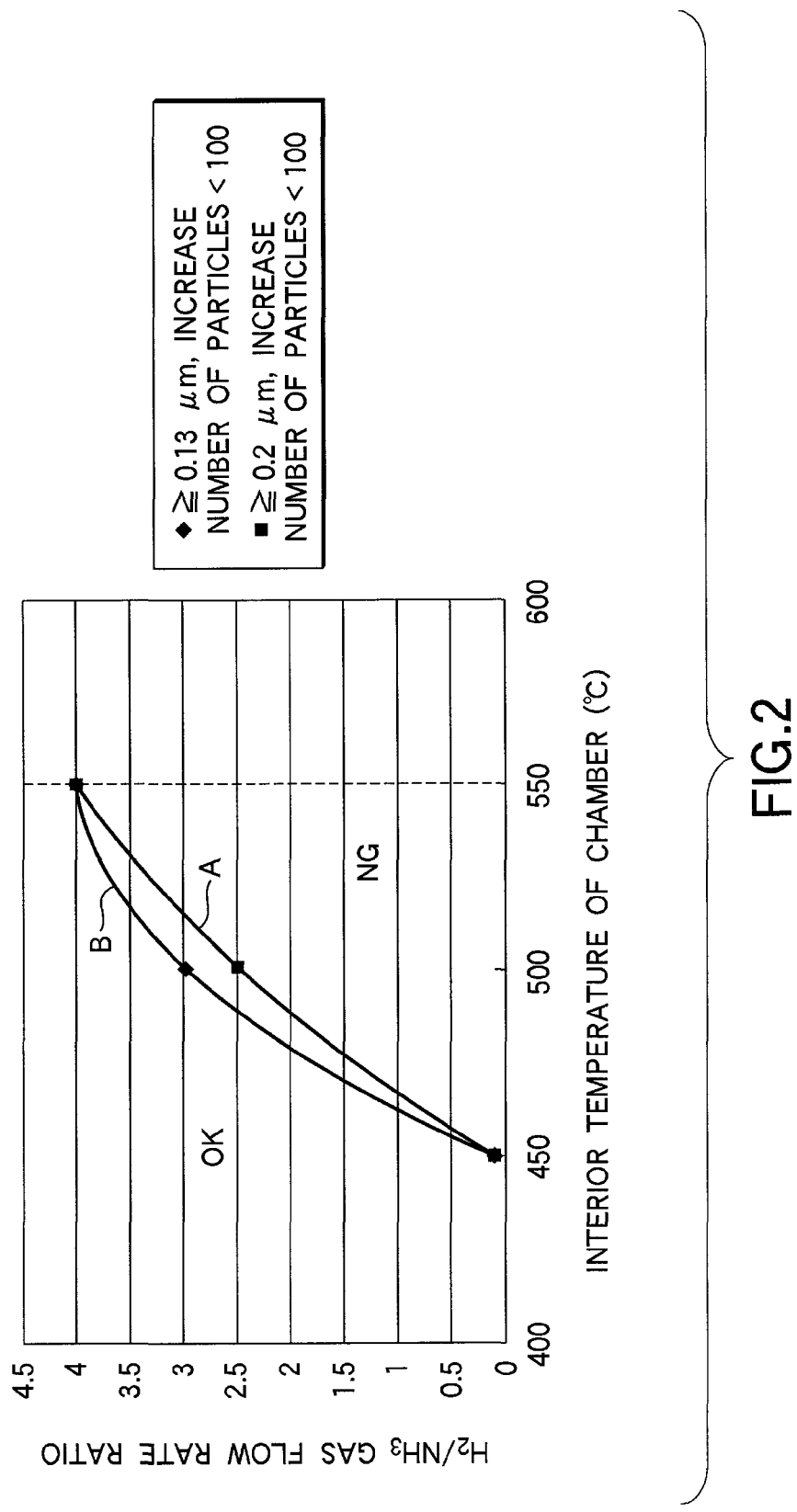
FIG. 2 shows a graph illustrating the relationship between the in-chamber temperature (the temperature of the coating layer) on the abscissa axis (x-axis) and the ratio of flow rate of $H_2$ to $NH_3$ ($H_2/NH_3$ gas flow rate ratio) on the ordinate axis (y-axis), in which a boundary between an acceptable region (denoted by "OK" and corresponding to a number of particles less than 100) and an unacceptable region (denoted by "NG" and corresponding to a number of particles not less than 100) occurs where the increase in the number of particles after a lot/batch of 200 mm diameter wafers are processed in the apparatus of FIG. 1 exceeds a predetermined threshold, i.e., 100.

FIG. 2 shows a graph illustrating a coordinate which is shown the relationship between the interior temperature of the chamber (the temperature of the Nickel-coating layer) on the abscissa axis (x-axis) and the $H_2/NH_3$ gas flow rate ratio on the ordinate axis (y-axis), in which the boundary between an acceptable region (denoted by "OK") and an unacceptable region (denoted by "NG") occurs where the increase in the number of particles after a lot (25 pieces) of 200 mm diameter wafers are processed exceeds a predetermined threshold. When the acceptable region denoted by "OK" was defined such that the increase in the number of particles having a size of not less than 0.2 micrometers was less than 100 and the unacceptable region denoted by "NG" was defined such that the increase was not less than 100, a boundary curve separating the acceptable and unacceptable regions was determined by the curve fitting, for a temperature range of not higher than 550° C., to obtain a curve is denoted by "A" as shown in FIG. 2. The curve "A" is given by the following equation (1):

$$y=-1.80\times10^{-4}x^2+2.19\times10^{-1}x-6.20\times10^1 \qquad (1)$$

When the $H_2/NH_3$ gas flow rate ratio is greater than the values of y given by the equation (1), the increase in the number of particles having a size of not less than 0.2 micrometers is less than 100 and thus the gas flow rate ratio should follow the inequality (2):

$$Y>-1.80\times10^{-4}x^2+2.19\times10^{-1}x-6.20\times10^1 \qquad (2)$$

Further, when a preferable process condition is selected, i.e., when the acceptable region was defined such that the increase in the number of particles having a size of not less than 0.13 micrometers is less than 100, the boundary curve was determined by the curve fitting, for a temperature range of not higher than 550 degrees C., to obtain a curve denoted by "B" as shown in FIG. 2. The curve "B" is given by the following equation (3):

$$y=-3.80\times10^{-4}x^2+4.19\times10^{-1}x-1.12\times10^2 \quad (3)$$

Accordingly, the desired $H_2/NH_3$ gas flow rate ratio should follow the inequality (4):

$$y>-3.80\times10^{-4}x^2+4.19\times10^{-1}x-1.12\times10^2 \quad (4)$$

Figure 3:
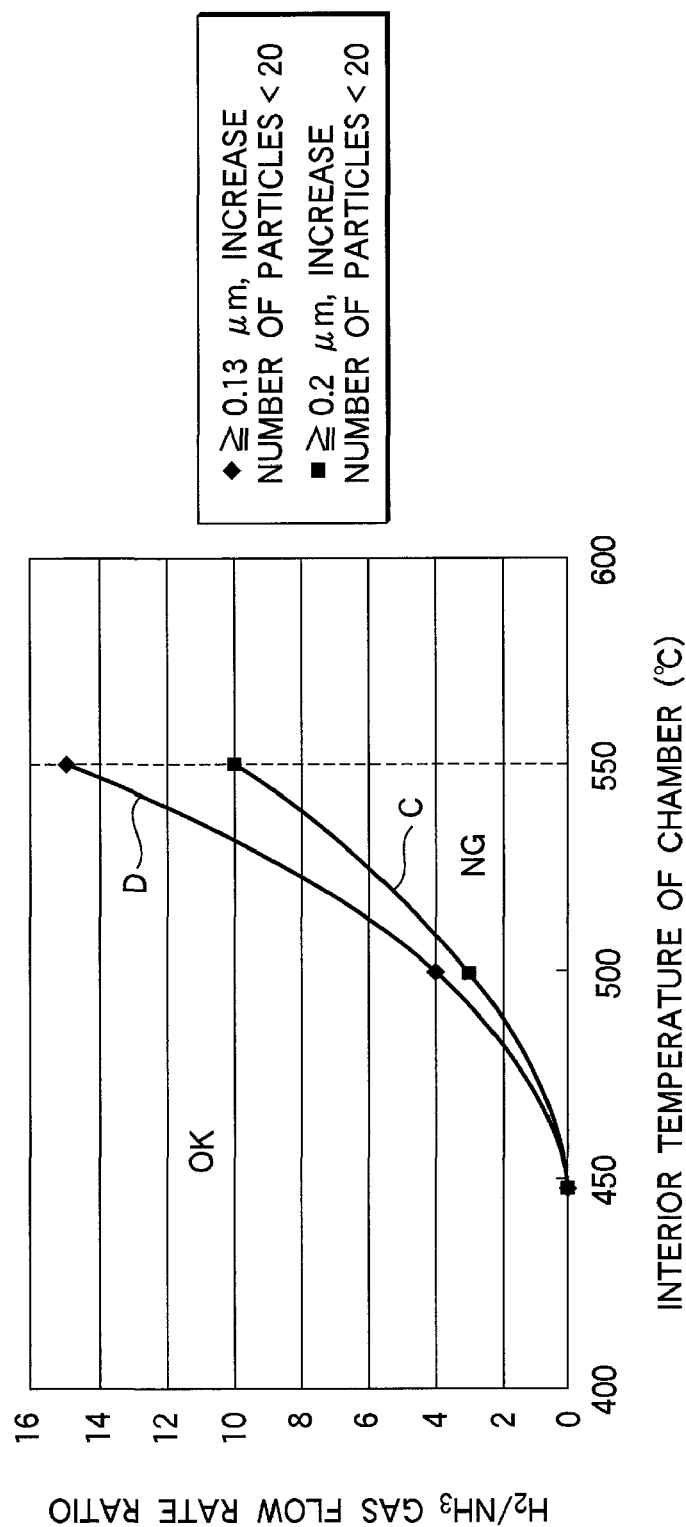
FIG. 3 shows a graph illustrating the relationship between the interior temperature of the chamber (the temperature of the coating layer) on the abscissa axis (x-axis) and the $H_2/NH_3$ gas flow rate ratio on the ordinate axis (y-axis), in which a boundary between an acceptable region (denoted by "OK" and corresponding to a number of particles less than 20) and an unacceptable region (denoted by "NG" and corresponding to a number of particles not less than 20) occurs where the increase in the number of particles after a lot/batch of 200 mm diameter wafers are processed in the apparatus of FIG. 1 exceeds a predetermined threshold, i.e., 20.

The above discussion applies to the case where the increase in the number of particles adhered on a wafer is less than 100, however, the case is more desirable where the increase in the number of particles having a size of not less than 0.20 micrometers is less than 20. Accordingly, when a boundary curve separating the acceptable region defined such that the increase in the number of particles having a size of not less than 0.2 micrometers was less than 20 and the unacceptable region defined such that the increase in the number of particles having a size of not less than 0.2 micrometers was not less than 20 was determined by the curve fitting in the same coordinate system, for a temperature range of not higher than 550° C., to obtain a curve denoted by "C" as shown in FIG. 3. The curve "C is given by the following equation (5):

$$y=8.1\times10^{-4}x^2-7.11\times10^{-1}x+1.56\times10^2 \quad (5)$$

Accordingly, the more preferable range is the inequality (6):

$$y>8.1\times10^{-4}x^2-7.11\times10^{-1}x+1.56\times10^2 \quad (6)$$

Further, a more appropriate condition is defined such that the increase in the number of particles having a size of not less than 0.13 micrometers is less than 20. The boundary curve of this case was determined by the curve fitting, for a temperature range of not higher than 550 degrees C., to obtain a curve denoted by "D" as shown in FIG. 3. The curve "D" is given by the following equation (7):

$$y=1.42\times10^{-3}x^2-1.27\times10^0x+2.85\times10^2 \quad (7)$$

Accordingly, the more preferable range is the inequality (8):

$$y>1.42\times10^{-3}x^2-1.27\times10^0x+2.85\times10^2 \quad (8)$$

It should be noted that since the above expressions are obtained by curve fitting, the $H_2/NH_3$ gas flow rate ratio can be chosen to have negative values (y<0). In such a case, it is necessary for the ratio to have lower limit equal to zero, i.e., y=0. For example, the ratio "y" can be chosen to have negative values (y<0) at a temperature lower than 450 degrees C. (x<450), however, in such a case, the ratio is equal to zero, i.e., y=0. Incidentally, in order to obtain the above expressions, the experiments were carried out under deposition conditions at a $H_2$ gas flow rate of 100 to 2000 mL/min (sccm) and a $NH_3$ gas flow rate of 100 to 1000 mL/min (sccm).

The foregoing description is applicable to the result of measurement of a 200 mm diameter wafer and in this case, in order to obtain the desired relationship between the $H_2/NH_3$ gas flow rate ratio and the temperature, the deposition conditions must be carefully selected at which the $H_2$ gas flows at a rate of not greater than 2000 mL/min (sccm).

In this manner, according to the embodiment, the $H_2/NH_3$ gas flow rate ratio and the interior temperature of the chamber temperature (the temperature of the coating layer) are controlled to suppress any undesired reaction of nickel contained in the showerhead 40 and the coating layers 31c, 66a, thereby allowing for the precise control of the number of particles of nickel-compounds down to a desired range of numbers.

Further, for example, when the conditions meet the above expressions (2), (4), (6), (8), the number of particles can be confidently reduced to within a required range. When the gas flow rate and the temperature are adjusted to be within a range defined by the above expressions, the heater power supply, valves, and mass flow controllers may be controlled by commands based on the recipe from the control section 80.

It should be noted that the above expressions are valid for the case where a nickel containing material is pure nickel and thus it is preferred that the nickel containing material is pure nickel, however, the above expressions are also valid for the case where a nickel containing material is nickel alloy.

Figure 4:
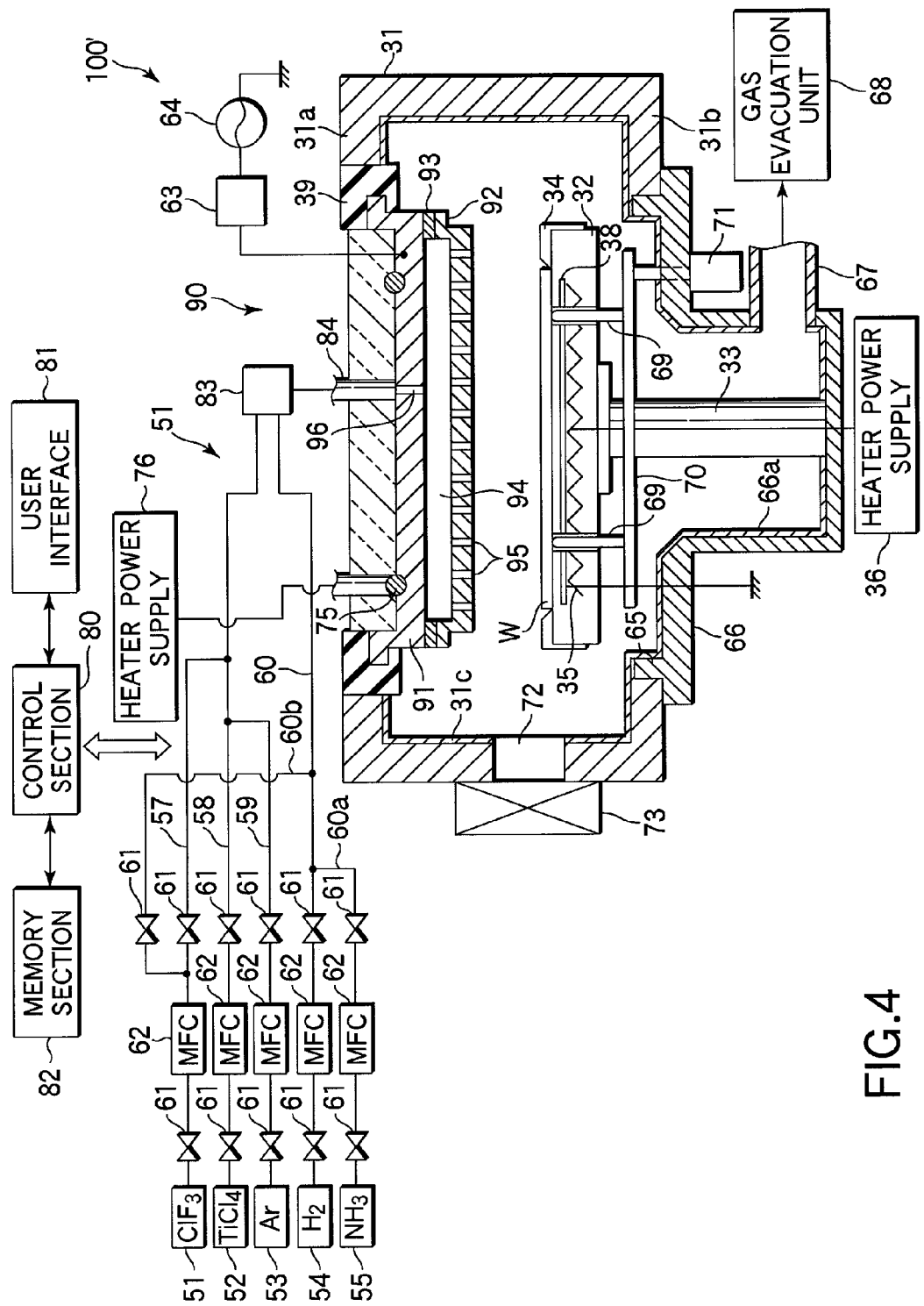
FIG. 4 is a schematic cross sectional view showing a Ti film deposition apparatus configured to implement a gas processing method according to the present invention.

Next, another embodiment of Ti film deposition apparatus implementing a gas delivery method will be explained. FIG. 4 is a schematic cross sectional view showing another Ti film deposition apparatus implementing a gas processing method according to the present invention. The Ti film deposition apparatus 100' is substantially the same as the Ti film deposition apparatus 100 of FIG. 1, except only that instead of the post-mix type showerhead 40 shown in FIG. 1, the apparatus 100' comprises a pre-mix type showerhead 90.

Conventionally, in this kind of Ti film deposition apparatus, it has been common knowledge to employ a post-mix type showerhead, as shown FIG. 1, in view of avoiding a phenomenon in which a reaction between $TiCl_4$ gas and $NH_3$ gas within a showerhead creates a by-product. However, it has been found that the use of a pre-mix type showerhead allows for the long term durability of hardware and enables a larger process margin to be achieved. Accordingly, the inventors have considered a process using the pre-mix type showerhead and found that the pre-mix type showerhead is available for use with the apparatus of the invention without any problem when process conditions are optimized. Further, the inventors found that in case the showerhead is of the pre-mix type, the TiN-film on the interior portion as well as the exterior portion of the showerhead can be precoated during the step of pre-coating with a TiN-film, thereby allowing a greater range of process conditions that prevent possible generation of nickel-containing particles during the nitriding process and after completion of the Ti film deposition process.

The above-mentioned apparatus will now be described in detail below.

As described above, the apparatus of FIG. 4 is different from the apparatus of FIG. 1 only in the structure of a showerhead and in how the gas is introduced into the showerhead, and thus the same elements as those of FIG. 1 are assigned the same numerical references and the description thereof will be omitted.

In the Ti-film deposition apparatus 100' shown in FIG. 4, a pre-mix type showerhead 90 is mounted to the ceiling wall 31a of the chamber 31 through an insulating member 39 and comprises a base member 91 and a shower plate 92 whose outer periphery is fixed using not shown screws to the base member 91 via an annular intermediate member 93 for preventing adherence of the shower plate 92. The shower plate 92 is in the form of a flange and has an internal concave circumferential recess therein, thereby forming a gas-diffusion space 94 between the base member 91 and the shower plate 92. The base member 91 has an outer peripheral flange portion 91a supported by the insulating member 39. The shower plate 92 has a plurality of gas discharge holes 95 and the base member 91 has a gas introduction hole 96 in the center thereof.

Further, a $TiCl_4$ gas supply line 58 and a $H_2$ gas supply line 60 are coupled to a gas mixing portion 83 where gases are mixed before flowing through a gas piping 84 and into the gas introduction hole 96. Then, the mixed gas is introduced through the introduction hole 96 into the gas diffusion space 94, flows through the gas discharge holes 95 and is distributed onto a wafer W.

Likewise, in the Ti-film deposition apparatus 100', a Ti-film deposition process is carried out, followed by a nitriding process in an ambient of $NH_3$ and $H_2$.

Likewise, in the Ti-film deposition apparatus, a Ti-film deposition process is carried out including the steps of: allowing gas evacuation means 68 to pull residual exhaust gas out from the chamber 31 in the absence of a wafer W in the chamber 31; allowing a heater 35 to preheat the chamber 31 while introducing Ar gas or $N_2$ gas into the chamber 31; and precoating with a thin film of TiN when the temperature becomes stable. The step of precoating with a thin film of TiN comprises the step of: first, allowing a high-frequency power supply 64 to apply a high-frequency power to a showerhead 90 while introducing Ar gas, $H_2$ gas, and $TiCl_4$ into the chamber 31 via the showerhead 90 at a predetermined flow rate, so that the gases are excited to a plasma state to cause deposition of a Ti film on the inner wall of the chamber 31, the inner wall of an exhaust chamber 66, and the surface of chamber components such as the showerhead 40; and nitriding the Ti film while supplying Ar gas, $H_2$ gas, and $NH_3$ gas and applying the high-frequency power to excite gases to a plasma state. The Ti-film deposition step and nitriding step are repeated, preferably 18 to 72 times, and the surface is precoated with a TiN film having a predetermined thickness.

During these steps, the plasma is not present within the showerhead 90, however, the inner surface of the showerhead 90 is also precoated with a TiN film by mean of thermal reaction without plasma. More specifically, the $TiCl_4$ gas remaining in the gas diffusion space 94 in the showerhead 90 after the Ti-film deposition step and the $NH_3$ gas supplied during the nitriding step thermally react to deposit a TiN film and consequently, as well as the inner wall of the chamber 31, the inner wall of the exhaust chamber 66, and the outer surface of the showerhead 90, the inner surface of the showerhead 90 are precoated with a TiN film. It follows that substantially the entire surface of the showerhead 90 is precoated with the TiN film.

After the precoating with a thin film of TiN, the deposition process is performed in substantially the same manner as previously discussed, the process comprising the steps of: transferring the wafer W to the chamber 31; introducing Ar gas into the chamber 31 and preheating the wafer W; when the temperature of the wafer becomes substantially stable, causing Ar gas, $H_2$ gas and $TiCl_4$ gas to enter through a pre-flow line; switching the flow from the pre-flow line to a film deposition line; and introducing the gas mixture through the showerhead 90 into the chamber 31 while applying a high-frequency power to the showerhead 90 by the high frequency power supply. During the above steps, the gas mixture of Ar, $H_2$ and $TiCl_4$ introduced into the chamber 31 is excited to a plasma state and chemically reacts and deposits a Ti film having a predetermined thickness on the wafer W. In this case, parameters such as the temperature to which the wafer W is heated, the frequency and level of electric power supplied from the high-frequency power supply 64 to the showerhead 90, etc., are almost the same as those for the apparatus of FIG. 1.

In this case, when the gas mixture of $TiCl_4$ and $H_2$ chemically reacts and deposits a titanium film, halogen-containing gas, i.e., HCl is also produced. Further, coating layers 31c, 66a composed of a nickel-containing material, typically composed of pure nickel or nickel-based alloy are formed in portions with which HCl comes in contact and thus react with HCl to form $NiCl_2$. Accordingly, also in this case, diffuse of $NiCl_2$ throughout the chamber and generation of metal contaminants are suppressed.

Next, in the same manner as that in the apparatus of FIG. 1, a nitriding process as a process in the atmosphere containing $NH_3$ and $H_2$ is performed. As described above, the nitriding process includes the steps of: stopping supply of $TiCl_4$ gas while keeping supply of $H_2$ and Ar gases; supplying $NH_3$ gas as nitriding gas while heating the interior of the chamber 31 (e.g., chamber wall, showerhead surface, etc.); simultaneously, allowing the high-frequency power supply 64 to apply a high-frequency power to the showerhead 90 to excite the process gas to a plasma state; and carrying out nitriding of the surface of the Ti thin film deposited on the wafer W in the presence of the process gas in a plasma state.

As described above, during the nitriding process, nickel-containing particles are produced because nickel contained in the coating layers 31c, 66a and showerhead 90 reacts with $NH_3$ supplied as nitriding gas. However, the reaction of nickel can be suppressed to reduce the amount of particle by controlling the temperature and the $H_2/NH_3$ gas flow rate ratio to fall within a specified range.

In this case, the showerhead 40 of the Ti-film deposition apparatus 100 shown in FIG. 1 is of the post-mix type and thus, during the step of precoating with a thin film of TiN (plasma-nitriding of a Ti film), the interior of the showerhead 40 is not precoated with the TiN film. Accordingly, precoated film of TiN hardly affects the range of process conditions that can suppress generation of nickel-containing particles. In contrast, the apparatus of the embodiment includes the showerhead 90 of the pre-mix type and thus, during the step of precoating with a thin film of TiN, the inner surface of the showerhead 90 is also precoated with the TiN film, whereby substantially the entire surface of nickel-containing material is precoated with a TiN film. Accordingly, the precoated film of TiN affects the range of process conditions that can suppress generation of nickel-containing particles. More specifically, the precoat TiN film acts as a protective layer and allows extending the range of process conditions that can suppress reaction of Ni.

In the following, details will be described.

As described above, it is required that an increase in the number of particles having a size of not less than 0.2 micrometers is less than 100 when one lot (25 pieces) of wafers are processed in the chamber. Preferably, the increase in the number of particles having a size of not less than 0.13 micrometers is less than 100 and more preferably, the increase in the number of particles having a size of not less than 0.10 micrometers is less than 100. Due to the presence of the TiN film, the reaction of nickel is less likely to occur in the apparatus of FIG. 4 than in the apparatus of FIG. 1. Accordingly, particles having a size of not less than about 0.10 micrometers can be taken into account when defining the allowable range of the increase in the number of particles. In the order to define the allowable range of the increase in the number of particles, the experiment was carried out using the apparatus of FIG. 4 so that chamber components were precoated with a TiN film and a Ti film deposited on a 300 mm diameter wafer was nitrided while the flow rate of $H_2$ and $NH_3$ gases and the interior temperature of chamber are changed. Afterwards, the state of adherence of particles to the wafer is obtained. Incidentally, pure nickel (NC nickel) was used as a material for the nickel-containing coating layer and the showerhead.

Figure 5:
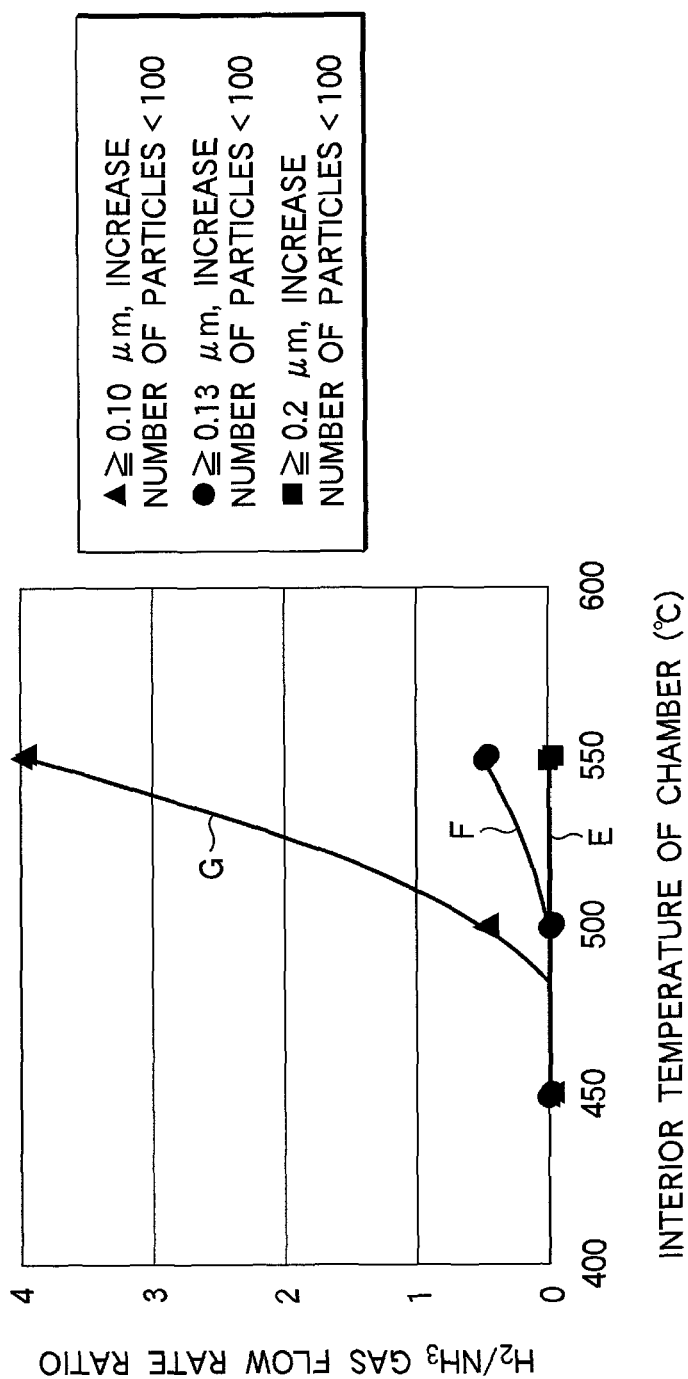
FIG. 5 shows a graph illustrating the relationship between the interior temperature of the chamber (the temperature of the coating layer) on the abscissa axis (x-axis) and the ratio of flow rate of $H_2$ to $NH_3$ ($H_2/NH_3$ gas flow rate ratio) on the ordinate axis (y-axis), in which a boundary between an acceptable region (denoted by "OK" and corresponding to a number of particles less than 100) and an unacceptable region (denoted by "NG" and corresponding to a number of particles not less than 100) occurs where the increase in the number of particles after a lot/batch of 300 mm diameter wafers are processed in the apparatus of FIG. 4 exceeds a predetermined threshold, i.e., 100.

FIG. 5 shows a graph illustrating a coordinate which is shown the relationship between the interior temperature of the chamber (the temperature of the nickel-coating layer) on the abscissa axis (x-axis) and the $H_2/NH_3$ gas flow rate ratio on the ordinate axis (y-axis), in which the boundary between an acceptable region (denoted by "OK") and an unacceptable region (denoted by "NG") occurs where the increase in the number of particles after a lot (25 pieces) of 300 mm diameter wafers are processed exceeds a predetermined threshold. When the acceptable region denoted by "OK" was defined such that the increase in the number of particles was less than 100 and the unacceptable region denoted by "NG" was defined such that the increase in the number of particles was not less than 100, a boundary curve separating the acceptable and unacceptable regions was determined by curve fitting, for a temperature range of not higher than 550 degrees C., to a curve.

According to the particles having a size of not less than 0.2 micrometers, the curve is given by y=0 (curve "E"), where the temperature given on the abscissa axis is not higher than 550 degrees C. In other words, regardless of film deposition temperature, any value of y is acceptable.

Further, when an preferable process condition is selected, i.e., when the acceptable region was defined such that the increase in the number of particles having a size of not less than 0.13 micrometers is less than 100, the boundary curve was determined by curve fitting, for a temperature range of not higher than 550 degrees C., to a curve denoted by "F" as shown in FIG. 5. The curve "F" is given by the following equation (9):

$$y=1.00\times10^{-4}x^2-9.50\times10^{-2}x+2.25\times10^1 \quad (9)$$

Accordingly, the desired $H_2/NH_3$ gas flow rate ratio should follow the inequality (10):

$$y=1.00\times10^{-4}x^2-9.50\times10^{-2}x+2.25\times10^1 \quad (10)$$

Further, when a more preferable condition is defined such that the increase in the number of particles having a size of not less than 0.10 micrometers is less than 100. The boundary curve of this case was determined by curve fitting, for a temperature range of not higher than 550 degrees C., to obtain a curve denoted by "G" as shown in FIG. 5. The curve "G" is given by the following equation (11):

$$y=6.00\times10^{-4}x^2-5.60\times10^{-1}x+1.31\times10^2 \quad (11)$$

Accordingly, the desired range is the inequality (12):

$$y>6.00\times10^{-4}x^2-5.60\times10^{-1}x+1.31\times10^2 \quad (12)$$

Figure 6:
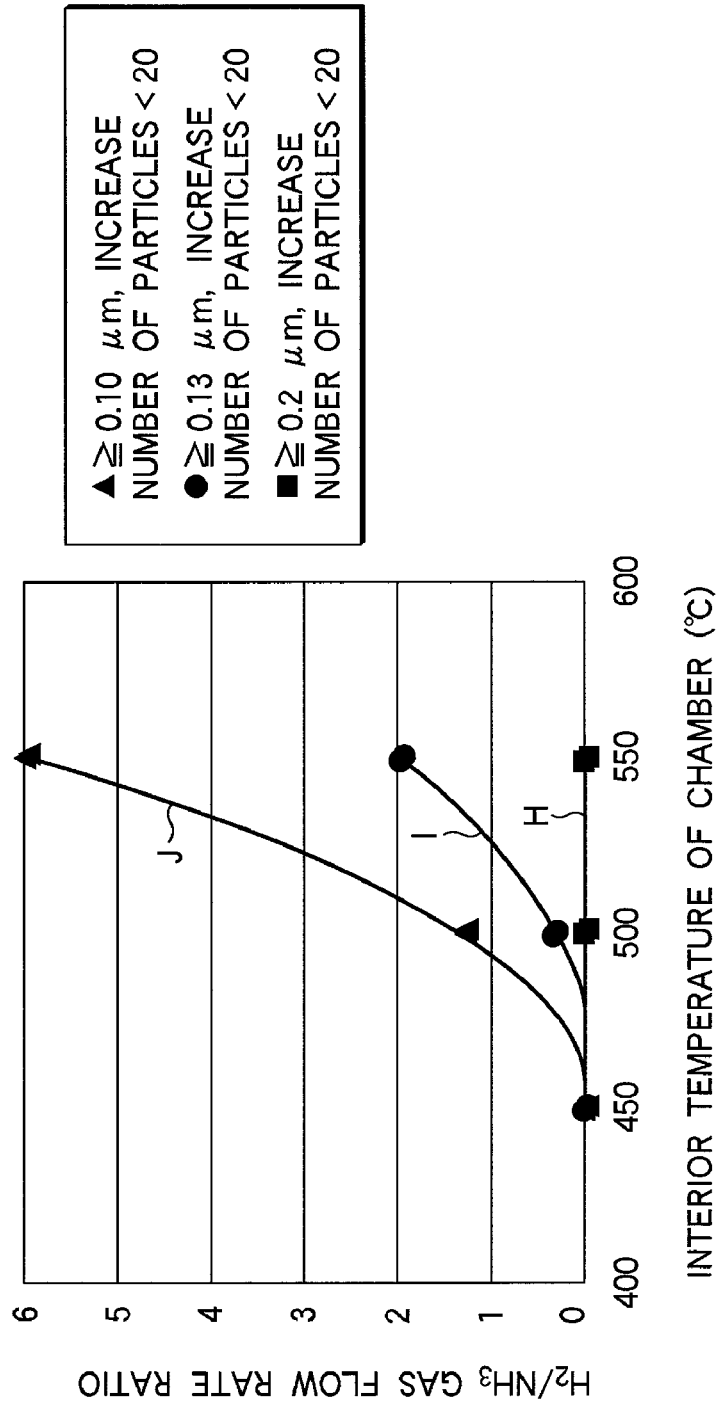
FIG. 6 shows a graph illustrating the relationship between the interior temperature of the chamber (the temperature of the coating layer) on the abscissa axis (x-axis) and the $H_2/NH_3$ gas flow rate ratio on the ordinate axis (y-axis), in which a boundary between an acceptable region (denoted by "OK" and corresponding to a number of particles less than 20) and an unacceptable region (denoted by "NG" and corresponding to a number of particles not less than 20) occurs where the increase in the number of particles after a lot/batch of 300 mm diameter wafers are processed in the apparatus of FIG. 4 exceeds a predetermined threshold, i.e., 20.

The above discussion applies to the case where the increase in the number of particles adhered on a wafer is less than 100, however, the case is more desirable where the increase in the number of particles having a size of not less than 0.20 micrometers is less than 20. In this case, a boundary curve separating the acceptable region defined such that the increase in the number of particles having a size of not less than 0.2 micrometers is less than 20 and the unacceptable region defined such that the increase in the number of particles having a size of not less than 0.2 micrometers is not less than 20 is expressed in the same coordinate system. As shown in FIG. 6, according to the present process condition, the boundary between the acceptable and unacceptable regions is given by y=0 (curve "H"), where the temperature given on the abscissa axis is not higher than 550° C. In other words, regardless of film deposition temperature, any value of y is acceptable.

A even more preferable condition is that the increase in the number of particles having a size of not less than 0.13 micrometers is less than 20. In this case, a boundary curve was determined by curve fitting, for a temperature range of not higher than 550° C., to obtain a curve denoted by "I" as shown in FIG. 6. The curve "I" is given by the following equation (13):

$$y=2.80\times10^{-4}x^2-2.60\times10^{-1}x+6.03\times10^1 \quad (13)$$

Accordingly, the even more preferable range is the inequality (14):

$$y>2.80\times10^{-4}x^2-2.60\times10^{-1}x+6.03\times10^1 \quad (14)$$

A further preferable condition is that the increase in the number of particles having a size of not less than 0.10 micrometers is less than 20. In this case, a boundary curve was determined by curve fitting, for a temperature range of not higher than 550° C., to a curve denoted by "J" as shown in FIG. 6. The curve "J" is given by the following equation (15):

$$y=6.68\times10^{-4}x^2-6.08\times10^{-1}x+1.38\times10^2 \quad (15)$$

Accordingly, the further preferable range is the inequality (16):

$$y>6.68\times10^{-4}x^2-6.08\times10^{-1}x+1.38\times10^2 \quad (16)$$

It should be noted that since the above expressions (9), (11), (13), (15), in addition to the previously derived expressions (1), (3), (5), (7), are obtained by curve fitting, the $H_2/NH_3$ gas flow rate ratio can be chosen to have negative values (y<0). In such a case, it is necessary for the ratio to have lower limit equal to zero, i.e., y=0. More specifically, the ratio "y" can be chosen to have negative values (y<0) at a temperature lower than 450 degrees C. (x<450), however, in such a case, the ratio is equal to zero, i.e., y=0. Incidentally, in order to obtain the above expressions, the experiments were carried out under deposition conditions at a $H_2$ gas flow rate of 250 to 5000 mL/min (sccm) and a $NH_3$ gas flow rate of 500 to 2000 mL/min (sccm).

In this embodiment, the foregoing description is applicable to the result of measurement of a 300 mm diameter wafer and in this case, in order to obtain the desired relationship between the $H_2/NH_3$ gas flow rate ratio and the temperature, it is preferable that $H_2$ gas flow rate is 5000 mL/min (sccm) or lower.

As described above, in the nitriding process implemented by the Ti-film deposition apparatus 100' of FIG. 4, the $H_2/NH_3$ gas flow rate ratio and the interior temperature of chamber (the temperature of the coating layer) are controlled to suppress any undesired reaction of nickel contained in the showerhead 90 and the coating layers 31c, 66a, thereby allowing for the precise control of the number of particles of nickel-compounds down to a desired range of numbers.

The showerhead 90 used in the Ti-film deposition apparatus 100' is of the pre-mix type. Accordingly, when the chamber components are precoated with a TiN film in which a Ti film is determined in the chamber 31 and nitrided process is performed before a Ti film is deposited on the wafer, $TiCl_4$ and $H_2$ gases react inside the showerhead 90 and deposit a TiN film on the inner surface of the showerhead. This significantly reduces the number of particles of nickel-compounds as compared to the case where the post-mix type showerhead in which interior is not precoated. Accordingly, the range in which the number of particles can be suppressed according to the required level can be much wider than that achieved with the Ti-film deposition apparatus 100 of FIG. 1.

It should be noted that the above expressions are valid for the case where a nickel containing material is pure nickel and thus it is preferred that the nickel containing material is pure nickel, however, the above expressions are also valid for the case where a nickel containing material is nickel alloy.

The present invention is not limited to the above embodiments and it may be modified in various manners. For example, in the above embodiments, a member at least the surface of which contains nickel (Ni) is implemented as the inner wall of a chamber and the showerhead. Alternatively, the member can be implemented as any one of the inner wall of a chamber and the showerhead, or as other member within the chamber. Further, in the above embodiments, the invention is applied to the situation where a Ti film is deposited. However, the invention is not limited to these embodiments, but may be applied to the situation where a film of other material such as Al, W, etc., is deposited. Further, the invention is not limited to the situation where a film is deposited, but can be generally applied to any situation where an object is exposed to a gas containing $NH_3$ and $H_2$ in the presence of a high temperature member at least the surface of which comprises nickel (Ni). Further, in the above embodiments, the coating layer containing nickel is formed on chamber members, however, a member consisting essentially of nickel, typically pure nickel or nickel alloy, may be provided in the chamber. Further, a substrate to be processed is not limited to a semiconductor wafer, but may be any other suitable substrate such as a liquid crystal display (LCD) substrate.

INDUSTRIAL APPLICABILITY

The invention is generally applicable to any situation where an object is exposed to a gas containing $NH_3$ and $H_2$ in the presence of a high temperature member at least the surface of which comprises nickel (Ni).

The invention claimed is:

1. A gas processing method in an apparatus comprising a chamber for accommodating a target substrate, an in-chamber member disposed inside the chamber, a gas supply system that supplies a process gas containing $NH_3$ gas and $H_2$ gas into the chamber, wherein a certain component of the chamber and/or the in-chamber member that is exposed to the process gas contains nickel (Ni), the method comprising:
deriving a reference formula representing a relationship between a process temperature inside the chamber and a flow rate ratio of $H_2/NH_3$ in the process gas on condition of a certain set threshold of the number of particles generated by supplying the process gas into the process chamber while heating an interior of the process chamber; and
then, performing a gas process on the target substrate by supplying the process gas into the process chamber while setting the process temperature at a selected value and setting the flow rate ratio at an application value, wherein the application value of the flow rate ratio is higher than a calculated value of the flow rate ratio obtained by substituting the selected value of the process temperature into the reference formula.

2. The method according to claim 1, wherein the application value of the flow rate ratio is given by the following expression, where x is the process temperature in a range of not higher than 550° C. and y is the application value of the flow rate ratio, $y > -1.80 \times 10^{-4} x^2 + 2.19 \times 10^{-1} x - 6.20 \times 10^1$.

3. The method according to claim 1, wherein the application value of the flow rate ratio is given by the following expression, where x is the process temperature in a range of not higher than 550° C.; and y is the application value of the flow rate ratio, $y > -3.80 \times 10^{-4} x^2 + 4.19 \times 10^{-1} x - 1.12 \times 10^2$.

4. The method according to claim 1, wherein the application value of the flow rate ratio is given by the following expression, where x is the process temperature in a range of not higher than 550° C. and y is the application value of the flow rate ratio, $y > 8.1 \times 10^{-4} x^2 - 7.11 \times 10^{-1} x + 1.56 \times 10^2$.

5. The method according to claim 1, wherein the application value of the flow rate ratio is given by the following expression, where x is the process temperature in a range of not higher than 550° C. and y is the application value of the flow rate ratio, $y > 1.42 \times 10^{-3} x^2 - 1.27 \times 10^0 x + 2.85 \times 10^2$.

6. The method according to any one of claims 2 to 5, wherein the flow rate of $H_2$ gas in the process gas is not greater than 2,000 mL/min.

7. The method according to claim 1, wherein between said deriving a reference formula and said performing a gas process, the method further comprises supplying a film formation gas containing $TiCl_4$ gas and $H_2$ gas from the gas supply system into the chamber to deposit a Ti film on the target substrate placed inside the chamber, and the gas process is used to nitride the Ti film by the process gas.

8. The method according to claim 1, wherein the certain component includes a showerhead for injecting the process gas into the chamber.

9. A gas processing method in an apparatus comprising a chamber for accommodating a target substrate, and a gas supply system that supplies gas into the chamber through a showerhead disposed inside the chamber, wherein certain components defining an inner surface of the chamber and the inner and outer surfaces of the showerhead contain nickel (Ni), the method comprising:
covering the certain components with a TiN pre-coating film by supplying $TiCl_4$ gas and $H_2$ gas from the gas supply system into the chamber through the showerhead, in the absence of the target substrate inside the chamber, to deposit a Ti pre-coating film on the certain components and then nitriding the Ti pre-coating film;
subsequent to said covering the certain components with a TiN pre-coating film, deriving a reference formula representing a relationship between a process temperature inside the chamber and a flow rate ratio of $H_2/NH_3$ in a process gas containing $NH_3$ gas and $H_2$ gas, on condition of a certain set threshold of the number of particles generated by supplying the process gas into the process chamber while heating an interior of the process chamber;
then, depositing a Ti film on the target substrate placed inside the chamber by supplying a film formation gas containing $TiCl_4$ gas and $H_2$ gas from the gas supply system into the chamber through the showerhead; and
then, performing a nitriding process on the Ti film by supplying the process gas into the process chamber while setting the process temperature at a selected value and setting the flow rate ratio at an application value, wherein the application value of the flow rate ratio is higher than a calculated value of the flow rate ratio obtained by substituting the selected value of the process temperature into the reference formula.

10. The method according to claim 9, wherein the showerhead is of a pre-mix type in which gases are mixed inside the showerhead and then discharged therefrom.

11. The method according to claim 9, wherein the application value of the flow rate ratio is given by the following expression, where x is the process temperature in a range of not higher than 550° C. and y is the application value of the flow rate ratio $$y>1.00\times10^{-4}x^2-9.50\times10^{-2}x+2.25\times10^1.$$

12. The method according to claim 9, wherein the application value of the flow rate ratio is given by the following expression, where x is the process temperature in a range of not higher than 550° C. and y is the application value of the flow rate ratio $$y>6.00\times10^{-4}x^2-5.60\times10^{-1}x+1.31\times10^2.$$

13. The method according to claim 9, wherein the application value of the flow rate ratio is given by the following expression, where x is the process temperature in a range of not higher than 550° C. and y is the application value of the flow rate ratio $$y>2.80\times10^{-4}x^2-2.60\times10^{-1}x+6.03\times10^1.$$

14. The method according to claim 9, wherein the application value of the flow rate ratio is given by the following expression, where x is the process temperature in a range of not higher than 550° C. and y is the application value of the flow rate ratio $$y>6.68\times10^{-4}x^2-6.08\times10^{-1}x+1.38\times10^2.$$

15. The method according to any one of claims 11 to 14, wherein the flow rate of $H_2$ gas in the process gas is not greater than 5,000 mL/min.

16. The method according to claim 1, wherein the reference formula is derived on the premise that the process gas is turned into plasma by a high frequency power and the process temperature and the selected value thereof fall within a range of 450 to 550° C.

17. The method according to claim 9, wherein the reference formula is derived on the premise that the process gas is turned into plasma by a high frequency power and the process temperature and the selected value thereof fall within a range of 450 to 550° C.

* * * * *